United States Patent
Blair et al.

(10) Patent No.: US 6,177,834 B1
(45) Date of Patent: Jan. 23, 2001

(54) OUTPUT MATCHED LDMOS POWER TRANSISTOR DEVICE

(75) Inventors: Cynthia Blair, Morgan Hill; Timothy Ballard, Gilroy; James Curtis, Morgan Hill, all of CA (US)

(73) Assignee: Ericsson, Inc., Morgan Hill, CA (US)

( * ) Notice: Under 35 U.S.C. 154(b), the term of this patent shall be extended for 0 days.

(21) Appl. No.: 09/204,666

(22) Filed: Dec. 2, 1998

(51) Int. Cl.$^7$ .................................................. A01L 25/00
(52) U.S. Cl. ......................... 327/566; 257/341; 257/401
(58) Field of Search ................................ 327/564, 565, 327/566; 257/341, 401

(56) References Cited

U.S. PATENT DOCUMENTS

| | | |
|---|---|---|
| 4,193,083 | 3/1980 | Max . |
| 4,393,392 | 7/1983 | Hale . |
| 5,309,014 | 5/1994 | Wilson ................................. 257/587 |
| 5,917,705 | * 6/1999 | Kirschbauer ......................... 257/679 |
| 6,025,277 | * 2/2000 | Chen et al. ........................... 438/738 |

FOREIGN PATENT DOCUMENTS

| | | | |
|---|---|---|---|
| 0 015 709 A1 | 9/1980 | (EP) | H01L/23/56 |
| 0 725 441 A2 | 8/1996 | (EP) | H01L/23/66 |
| 2 264 001 | 8/1993 | (GB) | H01L/23/48 |

OTHER PUBLICATIONS

Patent Abstracts of Japan, vol. 011, No. 182 (E–515), Jun. 11, 1987 (1987–06–11) & JP 62 013041 A (Mitsubishi Electric Corp.), Jan. 21, 1987 (1987–01–21) abstract.

Patent Abstracts of Japan, vol. 015, No. 355 (E–1109), Sep. 9, 1991 (1991–09–09) & JP 03 138953 A (NEC Corp.), Jun. 13, 1991 (1991–06–13) abstract.

* cited by examiner

*Primary Examiner*—Terry D. Cunningham
(74) *Attorney, Agent, or Firm*—Lyon & Lyon LLP

(57) ABSTRACT

An output-matched LDMOS RF power transistor device includes a semiconductor die having a plurality of interdigitated electrodes formed thereon, the electrodes each having respective input terminals and output terminals. An input lead is coupled to a first terminal of an input matching capacitor by a first plurality of conductors (e.g., bond wires), with a second terminal of the matching capacitor coupled to a ground. The first terminal of the matching capacitor is also coupled to the electrode input terminals by a second plurality of conductors. A conductive island isolated from the ground is coupled to the electrode output terminals by a third plurality of conductors. Output matching of the device is provided by a shunt inductance formed by a fourth plurality of conductors, which couple a first terminal of an output blocking capacitor the conductive island, with a second terminal of the blocking capacitor coupled to the ground. An output lead is coupled to the conductive island by a fifth plurality of conductors. In particular, the conductive island is disposed adjacent the semiconductor die, and the output blocking capacitor is disposed between the conductive island and output lead, such that transmission inductance through the respective third and fourth pluralities of conductors coupling the electrode output terminals to the blocking capacitor is sufficiently small to allow for output impedance matching of the transistor device at relatively high operating frequencies.

7 Claims, 2 Drawing Sheets

OUTPUT MATCHED LDMOS POWER TRANSISTOR DEVICE

BACKGROUND OF THE INVENTION

1. Field of the Invention

The present invention pertains generally to the field of radio frequency power transistors, and more specifically to methods and apparatus for output impedance matching of an LDMOS power transistor device.

2. Background

The use of radio frequency (RF) amplifiers, for example, in wireless communication networks, is well known. With the considerable recent growth in the demand for wireless services, such as personal communication services (PCS), the operating frequency of wireless networks has increased dramatically and is now well into the gigahertz (GHz) frequencies. At such high frequencies, LDMOS transistors have been preferred for RF power amplification devices, e.g., in antenna base stations.

In a typical deployment, an LDMOS RF power transistor device generally comprises a plurality of electrodes formed on a silicon die, each electrode comprising a plurality of interdigitated transistors. The individual transistors of each electrode are connected to respective common input (gate) and output (drain) terminals for each electrode. The die is attached, by a known eutectic die attach process, atop a metallic (source) substrate, which is itself mounted to a metal flange serving as both a heat sink and a ground reference. Respective input (gate) and output (drain) lead frames are attached to the sides of the flange, electrically isolated from the metal (source) substrate, wherein the input and output lead frames are coupled to the respective electrode input and output terminals on the silicon die by multiple wires (i.e., bonded to the respective terminals and lead frames).

Impedance matching the input and output electrode terminals to the respective input and output lead frames is crucial to proper operation of the amplifier device, especially at high operating frequencies.

By way of illustration, FIG. 1 shows a simplified electrical schematic of an unmatched LDMOS device, having an input (gate) lead 12, an output (drain) lead 14 and a source 16 through an underlying substrate. Transmission inductance through the input path, e.g., a plurality of bond wires connecting the input lead 12 to the common input terminal of the respective transistor fingers, is represented by inductance 18. Output inductance through the output path, e.g., a plurality of bond wires connecting the common output terminal of the respective transistors to the output lead 14, is represented by inductance 20.

FIG. 2 shows a known (matched) LDMOS power transistor device 40. The device 40 includes an input (gate) lead 42, output (drain) lead 44 and metallic (source) substrate 47 attached to a mounting flange 45. A first plurality of wires 48 couple the input lead 42 to a first terminal of an input matching capacitor 46. A second terminal of the input matching capacitor 46 is coupled to ground (i.e., flange 45). A second plurality of wires 52 couple the first terminal of matching capacitor 46 to the respective input terminals 49 of a plurality of interdigitated electrodes 51 formed on a semiconductor die 50 attached to the metallic substrate 47. By proper selection of the matching capacitor 46 and the series inductance of wires 48 and 52, the input impedance between the input lead 42 and electrode input terminals 49 can be effectively matched.

Respective output terminals 53 of the electrodes are coupled to the output lead 44 by a third plurality of wires 54. In order to impedance match the output of the device, a shunt inductance is used. Towards this end, the output lead 44 is coupled to a first terminal of a DC blocking capacitor 58 (i.e., an AC short) by a fourth plurality of wires 60, the blocking capacitor 58 having a substantially higher value than the input matching capacitor 46. FIG. 3 shows a schematic circuit representation of the device of FIG. 2, wherein the transmission inductance through the respective pluralities of wires is designated by the corresponding reference numbers of the wires in FIG. 2.

For "lower frequency" applications, e.g., 1500 MHz, the LDMOS device 40 of FIG. 2 may be adequately controlled, but at higher frequencies, e.g., 2 GHz, effective control of the device becomes difficult due to the relatively large series inductance generated through wires 54 to the shunt inductance 60. Further, because there is limited physical space on the electrode output terminals 53, the number of wires 54 connecting the plurality of electrodes 51 to the output lead 44 is thereby limited.

Thus, it would be desirable to provide an LDMOS RF power transistor device in which output matching at relatively high frequencies (e.g., GHz) can be more easily accomplished.

SUMMARY OF THE INVENTION

In accordance with a first aspect of the present invention, an RF power transistor device comprises a semiconductor die having a plurality of electrodes formed thereon, the electrodes having respective output terminals. A conductive island is provided adjacent the semiconductor die and is coupled to the electrode output terminals by a first plurality of conductors. A shunt inductance match is coupled from the conductive island by a second plurality of conductors to a blocking capacitor and an output lead is independently coupled to the conductive island by a third plurality of conductors.

By way of example, in a preferred embodiment, an LDMOS RF power transistor device includes a semiconductor die having a plurality of interdigitated electrodes formed thereon, the electrodes each having respective input terminals and output terminals. An input lead is coupled to a first terminal of an input matching capacitor by a first plurality of conductors (e.g., bond wires), with a second terminal of the matching capacitor coupled to a ground. The first terminal of the matching capacitor is also coupled to the electrode input terminals by a second plurality of conductors. A conductive island isolated from the ground is coupled to the electrode output terminals by a third plurality of conductors. Output matching of the device is provided by a shunt inductance formed by a fourth plurality of conductors coupling the conductive island to an output blocking capacitor, the blocking capacitor having a second terminal coupled to ground. An output lead is coupled to the conductive island by a fifth plurality of conductors.

The conductive island is preferably disposed adjacent the semiconductor die, and the output blocking capacitor is disposed between the conductive island and output lead, such that transmission inductance through the respective third and fourth pluralities of conductors coupling the electrode output terminals to the blocking capacitor is sufficiently small to allow for output impedance matching of the transistor device at relatively high operating frequencies.

As will be apparent to those skilled in the art, other and further aspects and advantages of the present invention will appear hereinafter.

BRIEF DESCRIPTION OF THE DRAWINGS

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figures 4, 5:
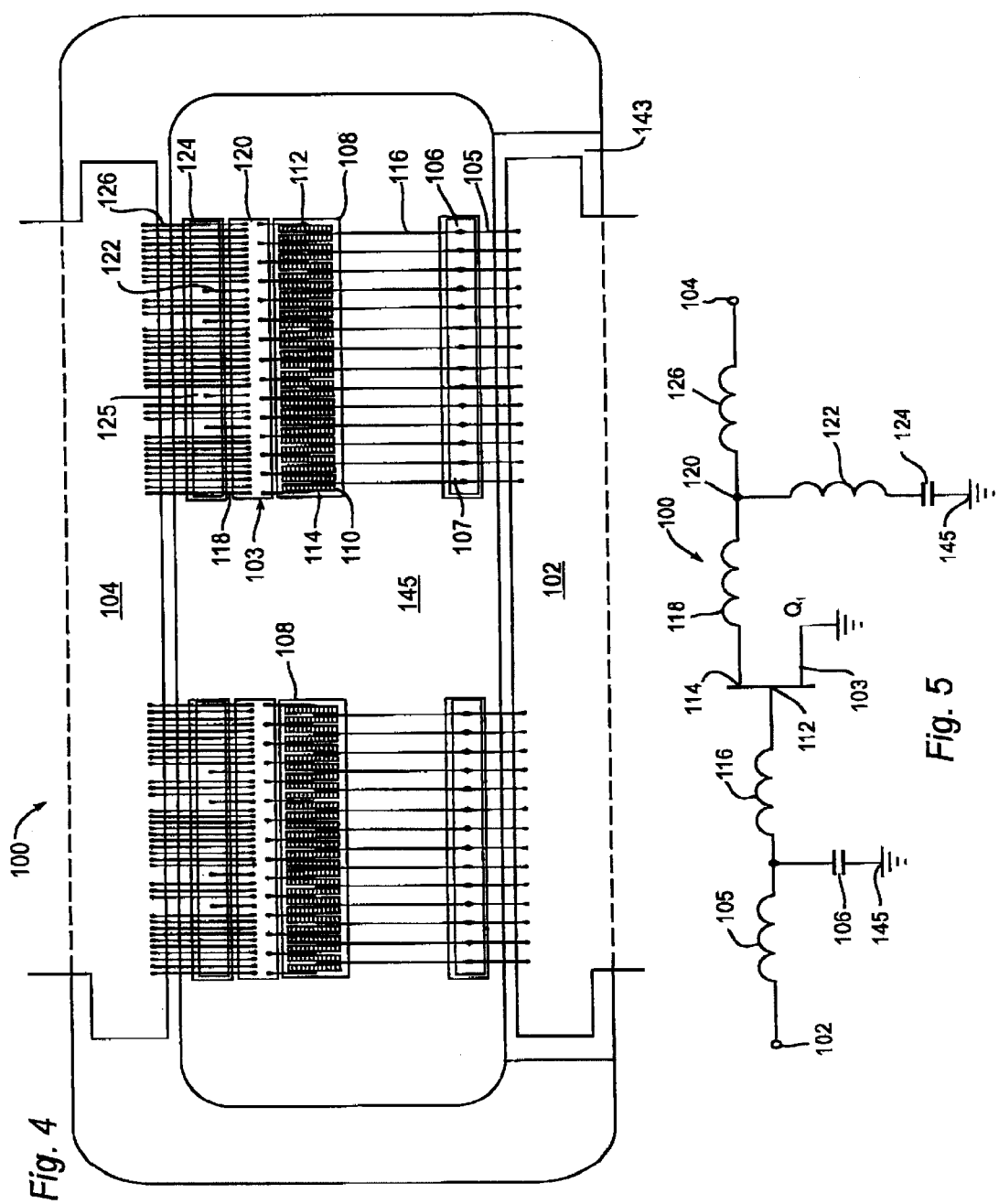
FIG. 4 is a top view of a preferred LDMOS RF power transistor device, according to the present invention.
FIG. 5 is a schematic circuit diagram of the LDMOS transistor device of FIG. 4.

Referring to FIGS. 4 and 5, a preferred LDMOS RF power transistor device 100 according to the present invention includes an input (i.e., gate) lead frame 102 and an output (i.e., drain) lead frame 104 attached to, but electrically isolated from, a conductive flange 145. By way of example, a ceramic substrate 143 may be used to isolate the respective lead frames 102 and 104 from the flange 145. Disposed on top of the flange is a metallic (i.e., source) substrate 103. In a preferred embodiment, the metallic (source) substrate comprises gold or a gold alloy.

A pair of semiconductor (e.g., silicon) dies 108 are attached to the metallic substrate 103, e.g., by ultrasonic scrubbing and/or thermal heating. Each die 108 has formed thereon a plurality of respective interdigitated electrodes 110, each electrode having respective input (gate) terminals 112 and output (drain) terminals 114. The respective input and output terminals 112 and 114 of the electrodes 110 on both dies 108 are connected to the respective lead frames 102 and 104 in the same manner. For ease in illustration, however, the remaining description will be directed to the electrodes 110 of just one of the dies 108.

Figure 1:
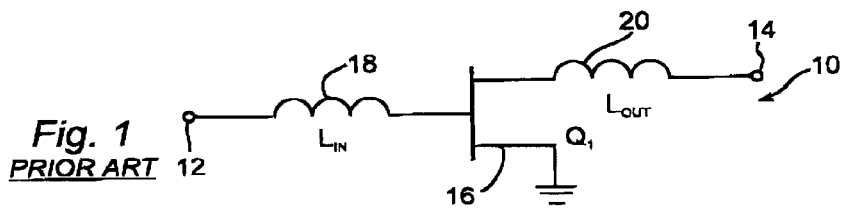
FIG. 1 is a schematic circuit diagram of an unmatched LDMOS power transistor.
Figure 2:
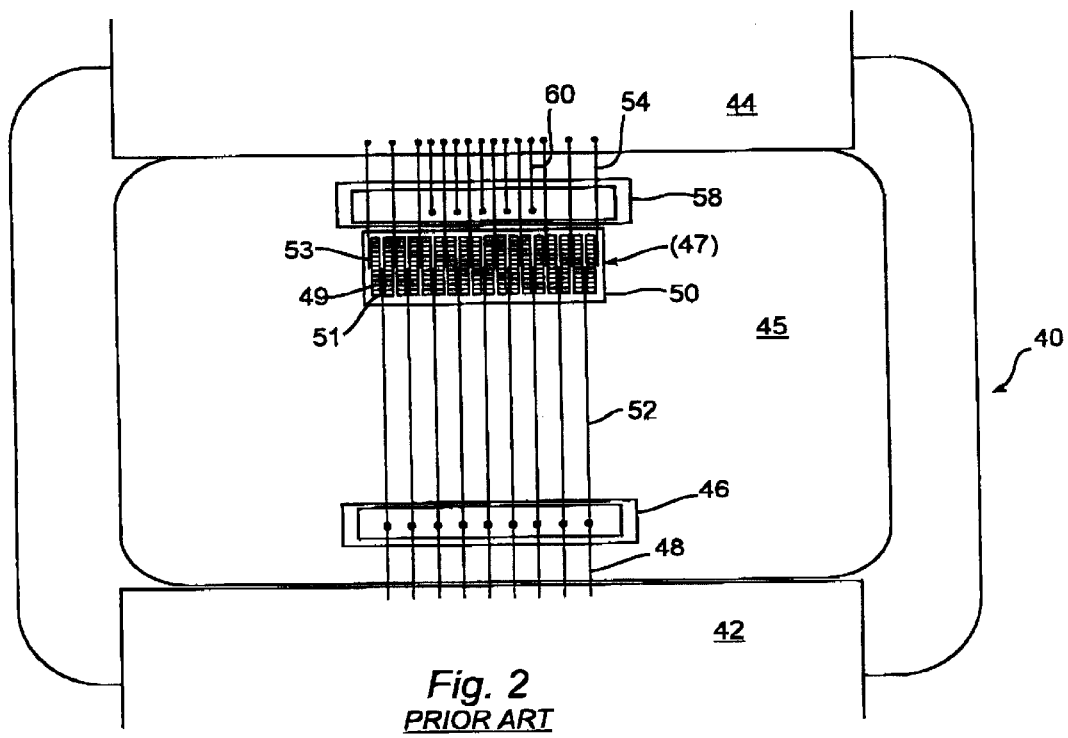
FIG. 2 is a partial top view of a prior art LDMOS RF power transistor device.
Figure 3:
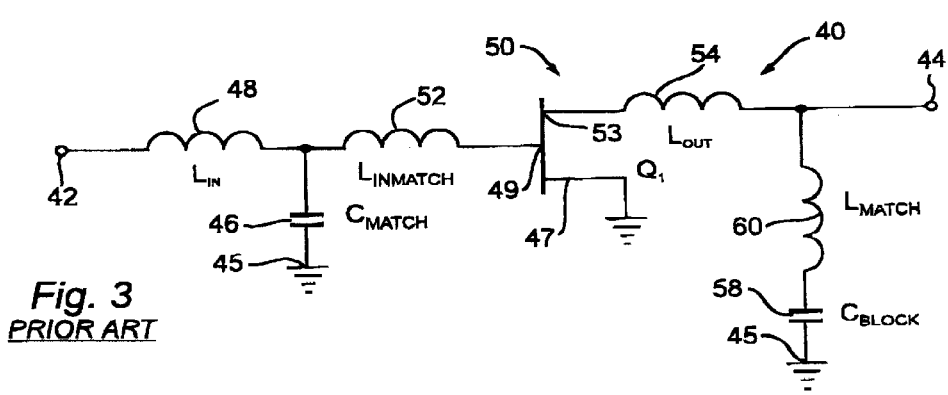
FIG. 3 is a schematic circuit diagram of the LDMOS transistor device of FIG. 2.

Input matching of the device 100 is performed similarly to that of the prior art device 40 shown in FIG. 2. Namely, an input matching capacitor 106 is located through the (source) substrate 103 adjacent to the input lead frame 102. The input matching capacitor 106 has a first terminal 107 coupled to the input lead frame 102 by a first plurality of bonded wires 105. In particular, the wires 105 are bonded at one end to the input lead frame 102 and at the other end to the first terminal 107 of the matching capacitor 106. The matching capacitor 106 has a second terminal (not shown) coupled to the (ground) flange 145. A second plurality of wires 116 couple the first terminal 107 of the matching capacitor 106 to the respective input terminals 112 of the electrodes 110, i.e., wires 116 are bonded at one end to the matching capacitor terminal 107 and at the other end to the respective electrode input terminals 112. Input matching of the device 100 is thereby performed by selection of the desired capacitance value of matching capacitor 106 and the inductance of wires 105 and 106.

In accordance with the present invention, output matching of the device 100 is accomplished as follows:

A conductive island 120 isolated from the flange 145 by a non-conductive material (e.g., alumina) is provided adjacent the semiconductor die 108, wherein the conductive island 120 is electrically isolated from the (ground) flange 145. A third plurality of bonded wires 118 couples the respective electrode output terminals 114 to the conductive island 120. An output blocking capacitor 124 is disposed through the metallic substrate 103 between the conductive island 120 and the output lead frame 104. A shunt inductance is formed by a fourth plurality of bonded wires 122, which coupled the conductive island to a first terminal 125 of the blocking capacitor 124. A second terminal (not shown) of the blocking capacitor 124 is coupled to the (ground) flange 145. The output lead frame 104 is independently coupled to the conductive island 120 by a fifth plurality of bonded wires 126.

Notably, the output series inductance though wires 118 and 122 coupling the electrode output terminals 114 to the shunt inductance 122 is significantly reduced over that of the prior art device 40 shown in FIG. 2. Further, the conductive island 120 in device 100 allows for a significantly greater number of wires 126 to be used for coupling the island 120 to the output lead 104 than in device 40, as the longer wires are not limited by the number of electrode output terminals 114. As such, output matching of device 100 may be more readily accomplished than in device 40, especially at relatively high operating frequencies, e.g., into gigahertz frequency bandwidths.

While preferred embodiments and applications of an output-matched LDMOS Power transistor device have been shown and described, as would be apparent to those skilled in the art, many modifications and applications are possible without departing from the inventive concepts herein.

Thus, the scope of the disclosed invention is not to be restricted except in accordance with the appended claims.

What is claimed is:

1. An RF power transistor device, comprising:
   a semiconductor having a plurality of electrodes formed thereon, the electrodes having respective output terminals; each electrode comprising a plurality of interdigitated transistors;
   a conductive island coupled to the electrode output terminals by a first plurality of conductors;
   an input matching capacitor having a first terminal coupled to an input lead frame by a second plurality of conductors carrying an input inductance and a second terminal coupled to a ground; said first terminal coupled to said semiconductor by a third plurality of conductors;
   an output blocking capacitor having a first terminal coupled to the conductive island by a fourth plurality of conductors and a second terminal coupled to the ground; and
   an output lead coupled to the conductive island by a fifth plurality of conductors carrying an output inductance.

2. The transistor device of claim 1, wherein the respective pluralities of conductors each comprise wires.

3. The transistor device of claim 1, wherein the conductive island is disposed adjacent the semiconductor, and the blocking capacitor is disposed between the conductive island and the output lead, such that transmission inductance through the respective first and fourth pluralities of conductors coupling the electrode output terminals to the blocking capacitor is small to allow for output impedance matching of the device at high operating frequencies.

4. An RF power transistor device, comprising:
   a first lead;
   a semiconductor having a plurality of electrodes formed thereon, the electrodes each having respective input terminals and output terminals; each electrode comprising a plurality of interdigitated transistors;

a first capacitor having a first terminal coupled to the first lead by a first plurality of conductors carrying an input inductance and coupled to the electrode input terminals by a second plurality of conductors;

a conductive island isolated from a ground and coupled to the electrode output terminals by a third plurality of conductors;

a second capacitor having a first terminal coupled to the conductive island by a fourth plurality of conductors, and a second terminal coupled to the ground; and a second lead coupled to the conductive island by a fifth plurality of conductors carrying an output inductance.

5. The transistor device of claim 4, wherein the respective pluralities of conductors each comprise wires.

6. The transistor device of claim 4, wherein the conductive island is disposed adjacent the semiconductor, and the second capacitor is disposed between the conductive island and the second lead, such that transmission inductance through the respective third and fourth pluralities of conductors coupling the electrode output terminals to the second capacitor is small to allow for output impedance matching of the device at high operating frequencies.

7. An LDMOS RF power transistor device, comprising:

an input lead frame;

a semiconductor having a plurality of electrodes formed thereon, the electrodes each having respective input terminals and output terminals, each electrode comprising a plurality of interdigitated transistors;

an input matching capacitor having a first terminal coupled to the input lead by a first plurality of wires carrying an input inductance and coupled to the electrode input terminals by a second plurality of wires, the input matching capacitor having a second terminal coupled to a ground;

a conductive island isolated from the ground and coupled to the electrode output terminals by a third plurality of wires;

an output blocking capacitor having a first terminal coupled to the conductive island by a fourth plurality of conductors and a second terminal coupled to the ground; and an output lead frame coupled to the conductive island by a fifth plurality of wires carrying an output inductance, wherein the conductive island is disposed adjacent the semiconductor, and the output blocking capacitor is disposed between the conductive island and the output lead frame, such that transmission inductance through the respective third and fourth pluralities of wires coupling the electrode output terminals to the first terminal of the output blocking capacitor is small to allow for output impedance matching of the device at high operating frequencies.

* * * * *